US012094961B2

(12) United States Patent
Lee

(10) Patent No.: US 12,094,961 B2
(45) Date of Patent: Sep. 17, 2024

(54) POWER SEMICONDUCTOR DEVICE AND POWER SEMICONDUCTOR CHIP

(71) Applicant: HYUNDAI MOBIS Co., Ltd., Seoul (KR)

(72) Inventor: Ju Hwan Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 237 days.

(21) Appl. No.: 17/547,777

(22) Filed: Dec. 10, 2021

(65) Prior Publication Data

US 2022/0190147 A1 Jun. 16, 2022

(30) Foreign Application Priority Data

Dec. 11, 2020 (KR) .................. 10-2020-0173331

(51) Int. Cl.
*H01L 29/739* (2006.01)
*H01L 29/10* (2006.01)
*H01L 29/40* (2006.01)

(52) U.S. Cl.
CPC ...... *H01L 29/7397* (2013.01); *H01L 29/1095* (2013.01); *H01L 29/407* (2013.01)

(58) Field of Classification Search
CPC ... H01L 29/7397; H01L 29/1095; H01L 29/407
USPC .................................................. 257/139
See application file for complete search history.

(56) References Cited

U.S. PATENT DOCUMENTS

| 2009/0283797 | A1* | 11/2009 | Takahashi | ........... H01L 29/7397 257/E29.198 |
| 2011/0018029 | A1 | 1/2011 | Pfirsch et al. | |
| 2014/0054644 | A1* | 2/2014 | Hikasa | ................ H01L 29/0696 257/139 |
| 2014/0077256 | A1* | 3/2014 | Hikasa | ................ H01L 29/7397 257/139 |
| 2018/0040612 | A1* | 2/2018 | Takahashi | ........... H01L 29/4236 |

(Continued)

FOREIGN PATENT DOCUMENTS

| KR | 10-1275458 B1 | 6/2013 |
| KR | 10-2014-0057630 A | 5/2014 |
| KR | 10-2153550 B1 | 9/2020 |

OTHER PUBLICATIONS

Office Action issued in corresponding Korean Patent Application No. 10-2020-0173331 dated Jan. 26, 2022.

*Primary Examiner* — Igwe U Anya
(74) *Attorney, Agent, or Firm* — MORGAN, LEWIS & BOCKIUS LLP

(57) ABSTRACT

A power semiconductor device includes a semiconductor layer, first trenches recessed into the semiconductor layer from a surface of the semiconductor layer, a drift region, having a first conductivity type, disposed in the semiconductor layer to extend from a lower side the first trenches to between the first trenches such that a vertical charge transport path is provided, a well region disposed in the semiconductor layer on the drift region between the first trenches and having a second conductivity type, an emitter region disposed on the well region and having the first conductivity type, a floating electrode layer disposed in each of the first trenches, a second trench extending through the well region to be in contact with the drift region, and a gate electrode layer disposed in the second trench.

14 Claims, 6 Drawing Sheets

(56) References Cited

U.S. PATENT DOCUMENTS

2021/0202723 A1\* 7/2021 Chen .................. H01L 29/4238
2021/0257473 A1\* 8/2021 Chen .................. H01L 29/4236

\* cited by examiner

POWER SEMICONDUCTOR DEVICE AND POWER SEMICONDUCTOR CHIP

CROSS-REFERENCE TO RELATED APPLICATION

This application claims the benefit of priority to Korean Patent Application No. 10-2020-0173331, filed in the Korean Intellectual Property Office on Dec. 11, 2020, the entire contents of which are incorporated herein by reference.

TECHNICAL FIELD

The present disclosure relates to a semiconductor device, and more particularly, to a power semiconductor device and a power semiconductor chip for switching power transmission.

BACKGROUND ART

A power semiconductor device is a semiconductor device operating in a high voltage and high current environment. The power semiconductor device is used in fields requiring high power switching, for example, an inverter device. For example, the power semiconductor device may include an insulated gate bipolar transistor (IGBT), a power MOSFET, and the like. The power semiconductor device requires basically breakdown characteristics to high voltage, and recently, additionally, a high-speed switching operation.

The semiconductor device operates when electrons injected from a channel and holes injected from a collector flow. However, in a trench gate type power semiconductor device, when holes are excessively accumulated in the trench gate, a negative gate charging (NGC) phenomenon occurs and a displacement current is generated in a gate direction. The trench gate type power semiconductor device has a large gate-to-collector capacitance (Cgc), which is greatly affected by the negative gate charging (NGC), thereby causing an issue in switching stability.

PRIOR ART LITERATURE (Patent Document 1) Republic of Korea Publication No. 20140057630 (published on May 13, 2014)

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power semiconductor device includes a semiconductor layer, at least a pair of first trenches recessed into the semiconductor layer from a surface of the semiconductor layer, a drift region, having a first conductivity type, disposed in the semiconductor layer to extend from a lower side of the at least pair of first trenches to between the at least pair of first trenches such that a vertical charge transport path is provided, a well region disposed in the semiconductor layer on the drift region between the at least pair of first trenches and having a second conductivity type, an emitter region disposed on the well region and having the first conductivity type, a floating electrode layer disposed in each of the at least a pair of first trenches, at least one second trench extending through the well region to be in contact with the drift region, and a gate electrode layer disposed in the at least one second trench.

A depth of the at least one second trench may be less than a depth of the at least pair of first trenches, and a depth of the gate electrode layer may be less than a depth of the floating electrode layer.

A floating region that is formed in the semiconductor layer outside the at least pair of first trenches and has the second conductivity type may be further included, and a bottom surface of the floating electrode layer may be surrounded by the floating region.

The at least one pair of first trenches and the at least one second trench may have a stripe type.

The well region may be bisected by the at least one second trench.

An emitter electrode layer connected to the emitter region may be further included.

A gate insulating layer may be further included on an inner surface of the at least one second trench, and the gate electrode layer may be disposed on the gate insulating layer to be disposed in the at least one second trench.

A collector region having the first conductivity type may be further included in the semiconductor layer under the drift region.

In another general aspect, a power semiconductor chip includes a semiconductor layer that includes a main cell region and a sensor region, a plurality of power semiconductor transistors disposed in the main cell region and each including the above power semiconductor device, a plurality of current sensor transistors disposed in the sensor region for monitoring currents of the power semiconductor transistors, an emitter terminal that is connected to emitter electrodes of the plurality of power semiconductor transistors, a current sensor terminal that is connected to emitter electrodes of the plurality of current sensor transistors, and a gate terminal that is connected to gate electrodes of the power semiconductor transistors and gate electrodes of the plurality of current sensor transistors.

Other features and aspects will be apparent from the following detailed description, the drawings, and the claims.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
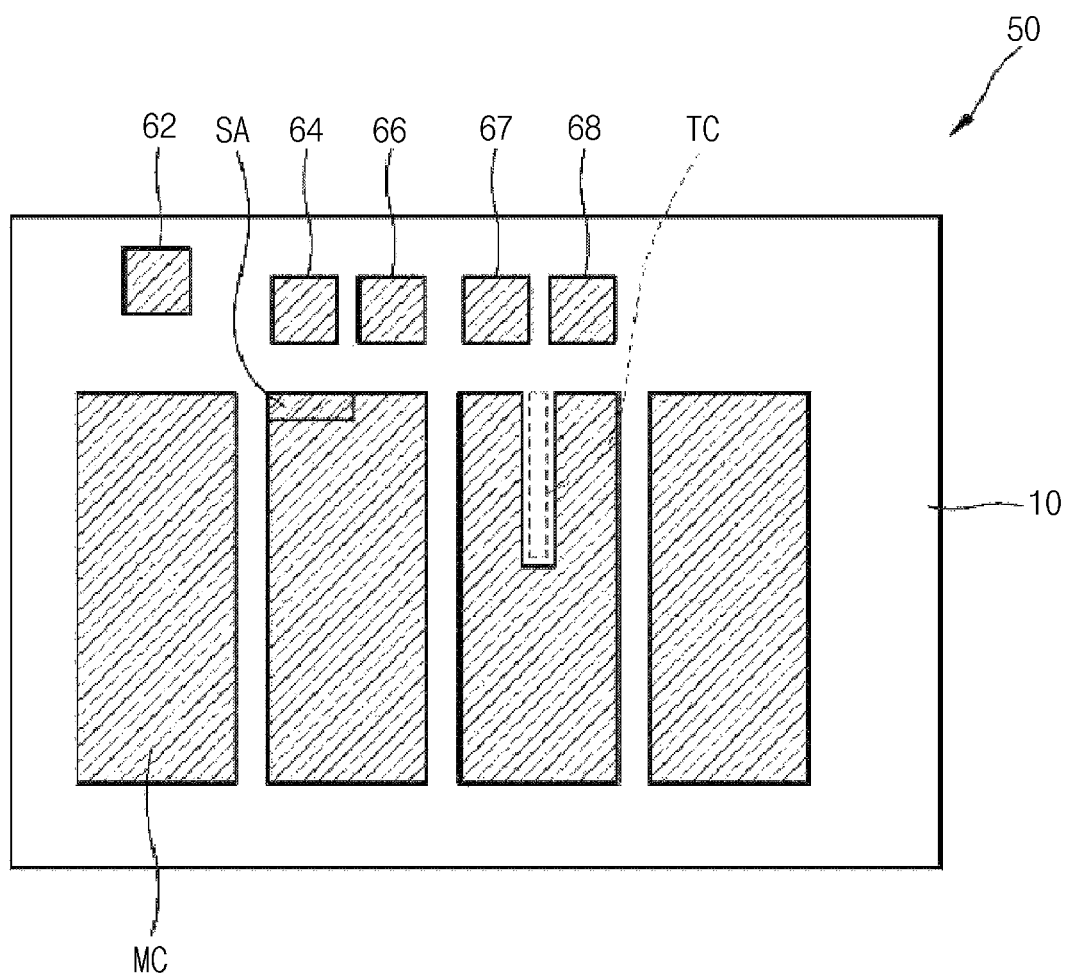
FIG. 1 is a schematic plan view showing a power semiconductor chip according to an embodiment of the present disclosure.

Hereinafter, an embodiment of the present disclosure will be described in detail with reference to the accompanying drawings. However, the present disclosure is not limited to the embodiments disclosed below, but may be implemented in various different forms. The following examples are provided to complete disclosure of the present disclosure, and to fully inform those of ordinary skill in the scope of the present disclosure. In addition, for convenience of description, at least some of the constituent elements may be exaggerated or reduced in size in the drawings. In the drawings, the same reference numerals refer to the same elements.

Unless otherwise defined, all terms used herein have the same meaning as commonly understood by one of ordinary skill in the art. In the drawings, the sizes of layers and regions are exaggerated for the sake of explanation, and thus are provided to explain the general structures of the present disclosure.

The same reference numerals denote the same elements. When referring to a configuration such as a layer, region, or substrate as being on another configuration, it will be understood that it is in the immediately upper trench of the other configuration or that there may also be other intervening configurations in between. On the other hand, when it is referred to as being "directly on" of another configuration, it is understood that there are no intervening configurations.

Figure 2:
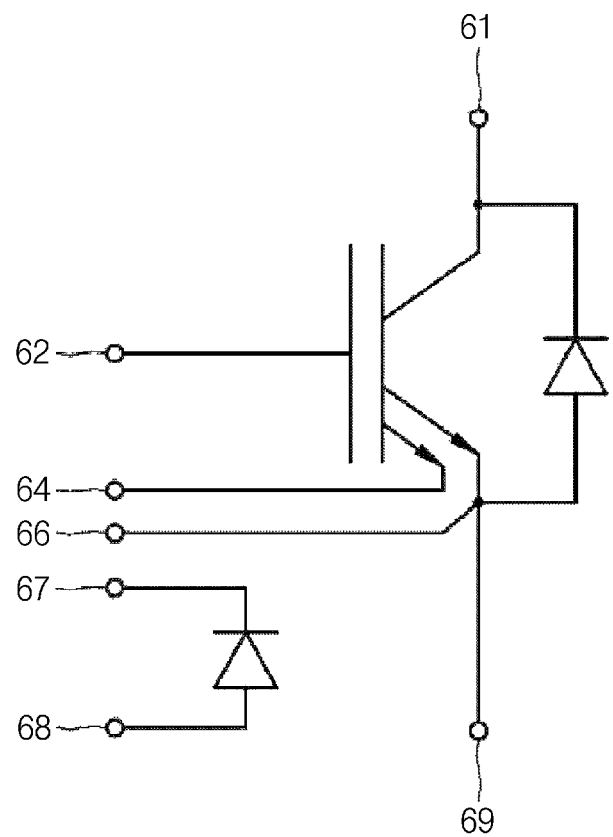
FIG. 2 is a circuit diagram showing a power semiconductor chip according to an embodiment of the present disclosure.
Figure 3:
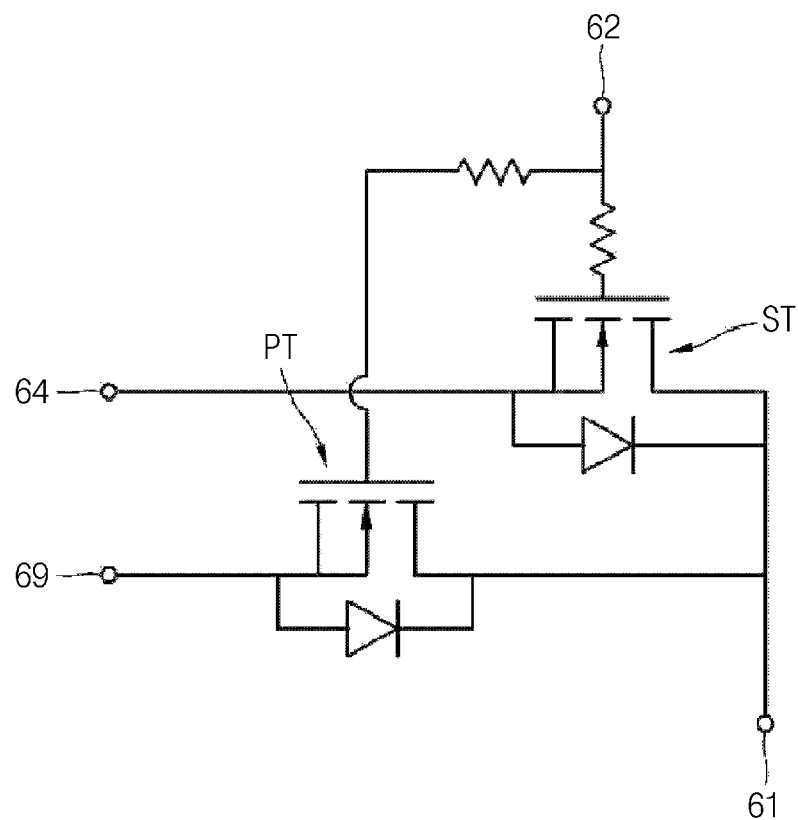
FIG. 3 is a circuit diagram showing a part of the power semiconductor chip of FIG. 2.

FIG. 1 is a schematic plan view showing a power semiconductor chip 50 according to an embodiment of the present disclosure, FIG. 2 is a circuit diagram showing the power semiconductor chip 50 according to an embodiment of the present disclosure, and FIG. 3 is a circuit diagram showing a part of the power semiconductor chip of FIG. 2.

Referring to FIG. 1, the power semiconductor chip 50 may be formed using a semiconductor layer 105 including a main cell area MC and a sensor area SA. The power semiconductor chip 50 may include a wafer die or packaging structure.

A plurality of power semiconductor transistors (PT of FIG. 3) may be formed in the main cell area MC. A plurality of current sensor transistors (ST of FIG. 3) may be formed in the sensor area SA to monitor currents of the power semiconductor transistors PT.

For example, the power semiconductor transistors PT and the current sensor transistors ST may include an insulated gate bipolar transistor (IGBT) or a power MOSFET structure. The IGBT may include a gate electrode, an emitter electrode, and a collector electrode. In FIGS. 2 to 3, a case in which the power semiconductor transistors PT and the current sensor transistors ST are IGBTs will be described as an example.

Referring to FIGS. 1 to 3, the power semiconductor chip 50 may include a plurality of terminals for connection with the outside.

For example, the power semiconductor chip 50 may include an emitter terminal 69 connected to an emitter electrode of the power semiconductor transistors PT, a current sensor terminal 64 connected to an emitter electrode of the current sensor transistors ST for monitoring current, a gate terminal 62 connected to gate electrodes of the power semiconductor transistors PT and gate electrodes of the current sensor transistors ST, and/or a collector terminal 61 connected to collector electrodes of the power semiconductor transistors PT and collector electrodes of the current sensor transistors ST.

In addition, the power semiconductor chip 50 may further include a Kelvin emitter terminal 66 connected to a Kelvin emitter electrode of the power semiconductor transistors PT and temperature sensor terminals 67 and 68 connected to the temperature sensor TC for monitoring temperature.

In FIG. 2, the collector terminal 61 may be formed on a rear surface of the semiconductor layer 105 of FIG. 1, and the emitter terminal 69 in FIG. 2 may be formed on the main cell area MC of FIG. 1.

The temperature sensor TC may include a junction diode connected to the temperature sensor terminals 67 and 68. The junction diode may include a junction structure between at least one n-type impurity region and at least one p-type impurity region, such as a P-N junction structure, a P-N-P junction structure, an N-P-N junction structure, and the like.

This structure exemplarily describes a structure in which the temperature sensor TC is embedded in the power semiconductor chip 50, but the temperature sensor TC may be omitted in a modified example of this embodiment.

The power semiconductor transistor PT is connected between the emitter terminal 69 and the collector terminal 61, and the current sensor transistor ST is partially connected in parallel with the power semiconductor transistor PT between the current sensor terminal 64 and the collector terminal 61. The gate electrode of the current sensor transistor ST and the gate electrode of the power semiconductor transistor PT are sharedly connected to the gate terminal 62 through a certain resistor.

The current sensor transistor ST may be formed in substantially the same structure as the power semiconductor transistor PT, but may be reduced to a specific ratio. Accordingly, an output current of the power semiconductor transistor PT may be indirectly monitored by monitoring an output current of the current sensor transistor ST.

Figure 4:
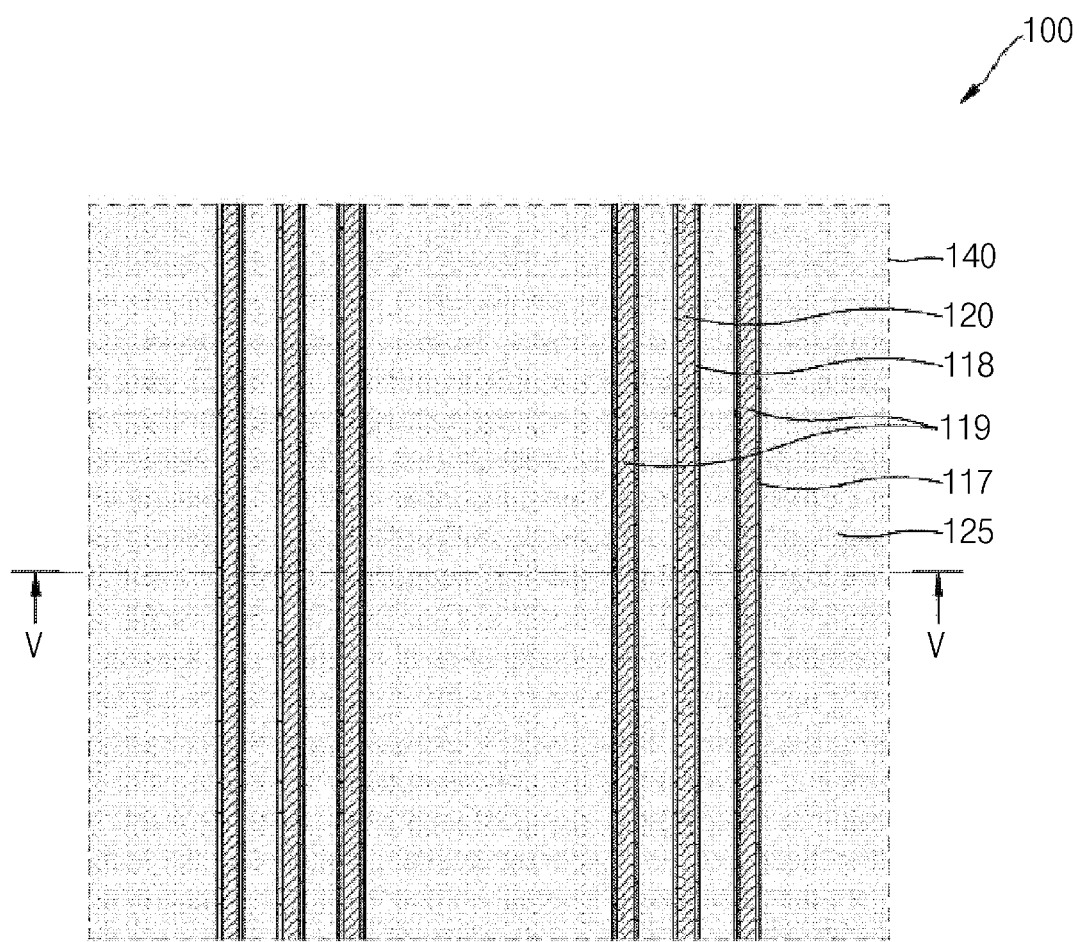
FIG. 4 is a plan view showing a power semiconductor device according to an embodiment of the present disclosure.
Figure 5:
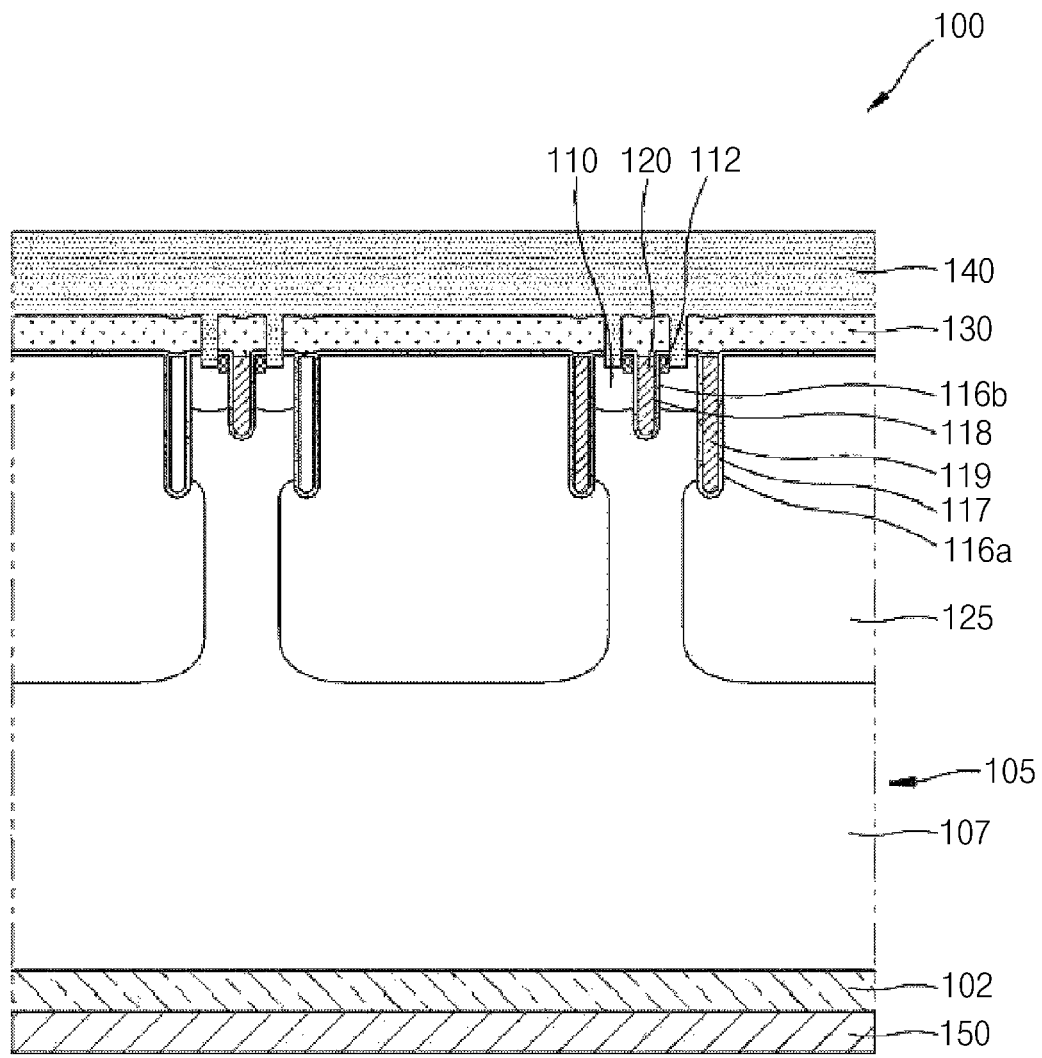
FIG. 5 is a cross-sectional view taken along line V-V of the power semiconductor device of FIG. 4.
Figure 6:
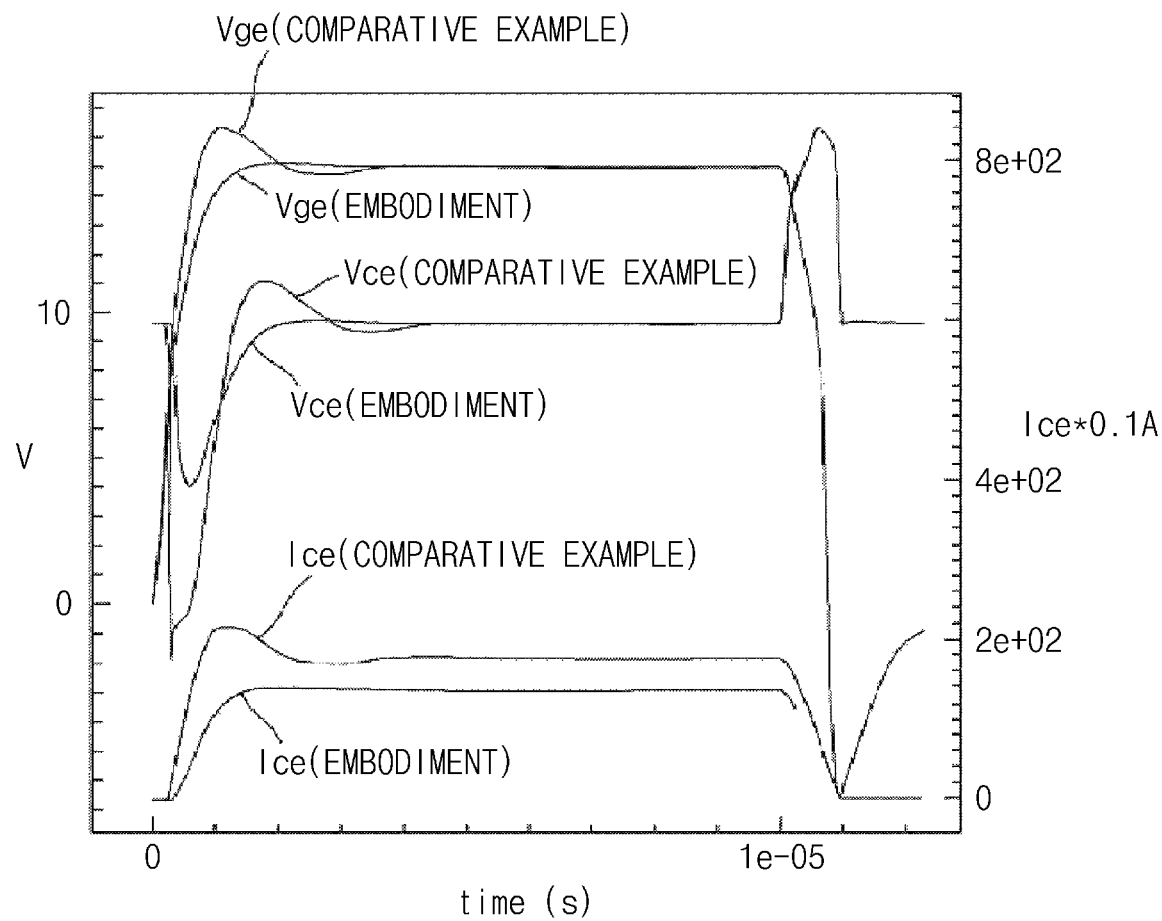
FIG. 6 is a graph illustrating operation characteristics of a power semiconductor device according to embodiments of the present disclosure and a power semiconductor device according to a comparative example.

For example, the power semiconductor transistor PT and/or the current sensor transistor ST may include a structure of a power semiconductor device 100 of FIGS. 4 to 6. In some embodiments, the power semiconductor transistor PT and the power semiconductor device 100 may be used interchangeably.

FIG. 4 is a plan view showing a power semiconductor device 100 according to an embodiment of the present disclosure, FIG. 5 is a cross-sectional view taken along line V-V of the power semiconductor device of FIG. 4.

Referring to FIGS. 4 and 5, the semiconductor layer 105 may refer to one or a plurality of semiconductor material layers, for example, may refer to a part of a semiconductor substrate and/or one or multiple epitaxial layers. The semiconductor substrate may include silicon, germanium, silicon-germanium.

For example, the semiconductor layer 105 may include a drift region 107 and a well region 110. The semiconductor layer 105 may further include a floating region 125 and an emitter region 112. Here, the emitter region 112 may be referred to as a source region, and hereinafter, the emitter region 112 may mean the source region.

The drift region 107 may have a first conductivity type and may be formed by implanting impurities of the first conductivity type into a portion of the semiconductor layer 105. The drift region 107 may provide a vertical transport path of charges. For example, the drift region 107 may be formed by doping impurities of the first conductivity type in the semiconductor layer 105. As another example, the drift region 107 may be formed with an epitaxial layer, and impurities of the first conductivity type may be doped in an epitaxial growth process.

The well region 110 may be formed in the semiconductor layer 105 on the drift region 107 and may have a second conductivity type. For example, the well region 110 may be formed in the semiconductor layer 105 so as to be in contact with at least a portion of the drift region 107. In some embodiments, the well region 110 may be formed by doping impurities of the second conductivity type opposite to the first conductivity type in the semiconductor layer 105 or the drift region 107. Meanwhile, the well region 110 may be called a base region in a bipolar junction transistor structure.

The emitter regions 112 may be respectively formed in the semiconductor layer 105 on the well regions 110 and may have the first conductivity type. For example, the emitter regions 112 may be formed by doping impurities of the first conductivity type in the semiconductor layer 105 or the well region 110. The concentration of the first conductivity-type impurities doped in the emitter region 112 may be higher than that doped in the drift region 107.

A collector region 102 may be provided under the drift region 107, and a collector electrode 150 may be provided under the collector region 102 so as to be connected to a collector region 128. For example, the collector region 102 may have the second conductivity type.

In some embodiments, the collector region 102 and/or the collector electrode 150 may constitute at least a part of a semiconductor substrate, and the drift region 107 may be formed on the semiconductor substrate, that is, on the collector region 102 and/or the collector electrode 150 with an epitaxial layer.

Meanwhile, in the case where the power semiconductor device 100 has a MOSFET structure, the collector region 102 may be omitted. In this case, the collector electrode 150 may be called a drain electrode, and the drain electrode may be formed to be in contact with the drift region 107.

At least a pair of first trenches 116a may be formed to be recessed into the semiconductor layer 105 from a surface of the semiconductor layer 105 as much as a given depth. Two pairs of first trenches 116a are illustrated in FIGS. 4 and 5. The number of first trenches 116a may be appropriately selected depending on the performance of the power semiconductor device 100, and embodiments are not limited thereto.

At least one second trench 116b may be formed between the first trenches 116a of each pair so as to be recessed into the semiconductor layer 105 from the surface of the semiconductor layer 105 as much as a given depth.

In addition, edges, for example, lower edges of the first trenches 116a and the second trench 116b may be rounded to suppress an electric field from being concentrated thereon.

A floating electrode layer 119 may be formed in the first trench 116a. In addition, an electrode insulating layer 117 may be formed on an inner surface of the first trench 116a. In detail, the floating electrode layer 119 may be formed on the electrode insulating layer 117 so as to bury the first trench 116a.

A gate electrode layer 120 may be formed in the second trench 116b. In addition, a gate insulating layer 118 may be formed on an inner surface of the second trench 116b. A thickness of the gate insulating layer 118 may be uniform, or a portion of the gate insulating layer 118, which is formed on a bottom surface of the second trench 116b, may be thicker than a portion of the gate insulating layer 118, which is formed on a side wall of the second trench 116b such that an electric field decreases at a bottom portion of the second trench 116b.

In detail, the gate electrode layer 120 may be formed on the gate insulating layer 118 so as to bury the second trench 116b. The gate electrode layer 120 may be formed to be recessed into the semiconductor layer 105; in this meaning, the gate electrode layer 120 may be understood as having a recess type or a trench type.

For example, the electrode insulating layer 117 and the gate insulating layer 118 may include an insulating material such as silicon oxide, silicon carbide oxide, silicon nitride, hafnium oxide, zirconium oxide, or aluminum oxide, or may include a stacked structure thereof.

In addition, the floating electrode layer 119 and the gate electrode layer 120 may include an appropriate conductive material such as polysilicon, metal, metal nitride, or metal silicide, or may include a stacked structure thereof.

The floating electrode layer 119 and the gate electrode layer 120 may have similarity in that the floating electrode layer 119 and the gate electrode layer 120 are formed of a conductive material. However, the floating electrode layer 119 and the gate electrode layer 120 may differ from each other in that the floating electrode layer 119 is floated without connection with an external power supply voltage and the gate electrode layer 120 is connected with the external power supply voltage through a gate terminal.

In some embodiments, to provide a vertical transport path of charges, the drift region 107 may be formed in the semiconductor layer 105 so as to extend from a lower side of the first trenches 116a to between the first trenches 116a. The well region 110 may be formed in the semiconductor layer 105 on the drift region 107 between the first trenches 116a.

The floating region 125 may be formed in the semiconductor layer 105 outside the first trenches 116a and may have the second conductivity type. For example, the floating region 125 may be formed by implanting impurities of the second conductivity type into the semiconductor layer 105 or the drift region 107.

In addition, the floating region 125 may be formed to surround the bottom surface of the first trench 116a. As such, to alleviate the concentration of the electric field on the bottom surface of the floating electrode layer 119, the bottom surface of the floating electrode layer 119 may be formed to be surrounded by the floating region 125.

In some embodiments, the second trench 116b may be disposed between the first trenches 116a. As such, the second trench 116b may be formed to be in contact with the drift region 107 through the well region 110 between the first trenches 116a.

In addition, a depth of the second trench 116b may be thinner than a depth of the first trenches 116a. As such, a depth of the gate electrode layer 120 may be thinner than a depth of the floating electrode layer 119.

An interlayer insulating layer 130 may be formed on the gate electrode layer 120. For example, the interlayer insulating layer 130 may include an appropriate insulating material such as an oxide layer or a nitride layer, or may include a stacked structure thereof.

An emitter electrode layer 140 may be disposed on the emitter region 112 so as to be connected to the emitter region 112. For example, the emitter electrode layer 140 may be disposed to extend from the emitter region 112 onto the interlayer insulating layer 130.

For example, the emitter electrode layer 140 may include an appropriate conductive material such as polysilicon, metal, metal nitride, or metal silicide, or may include a stacked structure thereof.

In addition, the emitter electrode layer 140 may be further connected to the well region 110. For example, the well region 110 may include a highly doped region at a portion thereof, and the emitter electrode layer 140 may be connected to the highly doped region.

In some embodiments, the first trenches 116a and the second trench 116b may be disposed in a line type or a stripe type. As such, the floating electrode layer 119 and the gate electrode layer 120 may also be formed in a line type or a stripe type in which they extend in one direction.

In addition, because the gate electrode layer 120 extends to penetrate the well region 110, the well region 110 may be bisected by the second trench 116b and/or the gate electrode layer 120. As such, when a turn-on voltage is applied to the gate electrode layer 120, a channel may be formed in the well region 110 on opposite sides thereof.

In the power semiconductor device 100, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In the power semiconductor device 100, the impurity implantation or the impurity doping of the drift region 107, the well region 110, and the emitter region 112 may be performed by implanting the impurities into the semiconductor layer 105 or such that the impurities are mixed when an epitaxial layer is formed. However, an ion implantation method using a mask pattern may be used to implant impurities into a selective region. Optionally, a heat treatment process for activating or diffusing the impurities may be performed after the ion implantation.

Also, a patterning process for forming the floating electrode layer 119, the gate electrode layer 120, and/or the emitter electrode layer 140 may be performed by using photo lithography and etching processes. The photo lithography process may include a process of forming a photoresist pattern as a mask layer by using a photo process and a development process, and the etching process may include a process of selectively etching an underlying structure by using the photoresist pattern.

According to the power semiconductor device 100 described above, a displacement current through the floating region 125 may be suppressed by disposing the floating electrode layers 119 on opposite sides of the gate electrode layer 120. In addition, as the floating electrode layer 119 is floated without connection with the emitter electrode layer 140, the reduction of a withdraw voltage characteristic and a snapback phenomenon may be suppressed.

In addition, by making a depth of the floating electrode layer 119 deeper than that of the gate electrode layer 120, the effect that the gate electrode layer 120 is surrounded by the floating region 125 and the floating electrode layer 119 may be obtained, and thus, the concentration of the electric field on the gate electrode layer 120 may be suppressed through the charge sharing effect. This may mean that the electrical breakdown is prevented.

Also, according to the power semiconductor device 100 described above, because the gate electrode layer 120 is surrounded by the well region 110 without contact with the floating region 125, a gate-collector capacitance by gate-collector capacitive coupling may decrease, and a gate-emitter capacitance by gate-emitter capacitive coupling may increase. In addition, the gate-collector capacitance may further decrease by making the depth of the gate electrode layer 120 smaller than that of the floating electrode layer 119.

Thus, according to the power semiconductor device 100, a negative gate charging phenomenon may be suppressed with a high withdraw voltage maintained, and the stability of switching may be improved.

FIG. 6 is a graph illustrating operation characteristics of a power semiconductor device according to embodiments of the present disclosure and a power semiconductor device according to a comparative example. In FIG. 6, a comparative example indicates a power semiconductor device of a conventional trench structure, and an embodiment indicates the power semiconductor device 100 having the structure described above.

Referring to FIG. 6, in the case of comparative example, it is understood that, in a switching operation of a power semiconductor device, oscillation appears at a gate-emitter voltage Vge, a gate-collector voltage Vgc, and a collector-emitter current Ice, and a peak is observed. In contrast, in the case of the embodiment, it is understood that, in a switching operation of a power semiconductor device, oscillation hardly appears thereat and a peak is hardly observed.

In FIGS. 1 to 3, the power semiconductor chip 50 may use the power semiconductor device 100 of FIG. 4 as the power semiconductor transistor PT and/or the current sensor transistor ST, and thus, a characteristic of the power semiconductor device 100 described above may be applied to the power semiconductor chip 50 without modification.

For example, in the case where the power semiconductor device 100 is implemented as the power semiconductor transistor PT and the current sensor transistor ST, it may be understood as a structure in which the gate electrode layer 120, the emitter electrode layer 140, and the collector electrode 150 of the power semiconductor device 100 correspond to a gate electrode, an emitter electrode, and a collector electrode of each of the power semiconductor transistor PT and the current sensor transistor ST, respectively.

Thus, according to the power semiconductor device 100 and the power semiconductor chip 50 described above, a negative gate charging phenomenon may be suppressed with a high withdraw voltage maintained, and the stability of switching may be improved.

The above descriptions are given under the assumption that a power semiconductor device is an IGBT, but may be applied to a power MOSFET without modification. However, the collector region 102 may be absent from the power MOSFET, and a drain electrode may be disposed instead of the collector electrode 150.

The effect is illustrative, and the scope of the present disclosure is not limited thereby.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
   a semiconductor layer;
   at least a pair of first trenches recessed into the semiconductor layer from a surface of the semiconductor layer;
   a drift region, having a first conductivity type, disposed in the semiconductor layer to extend from a lower side of the at least pair of first trenches to between the at least pair of first trenches such that a vertical charge transport path is provided;
   a well region disposed in the semiconductor layer on the drift region between the at least pair of first trenches, and having a second conductivity type;
   an emitter region disposed on the well region and having the first conductivity type;
   a floating electrode layer disposed in each of the at least pair of first trenches;
   at least one second trench extending through the well region to be in contact with the drift region;

a gate electrode layer disposed in the at least one second trench;

an interlayer insulating layer disposed over the floating electrode layer and the gate electrode layer;

an electrode insulating layer disposed in the at least pair of first trenches, and disposed between the interlayer insulating layer and the floating electrode layer to cover a top surface of the floating electrode layer;

a gate insulating layer disposed in the at least one second trench and without between the interlayer insulating layer and the gate electrode layer; and a floating region disposed in the semiconductor layer outside the at least pair of first trenches and having the second conductivity type, wherein a bottom surface of the floating electrode layer is surrounded by the floating region, and a length of the floating region vertically extending from a bottom surface of the at least pair of first trenches is longer than a length of the floating electrode layer extending in a vertical direction.

2. The power semiconductor device of claim 1, wherein a depth of the at least one second trench is less than a depth of the at least pair of first trenches, and wherein a depth of the gate electrode layer is less than a depth of the floating electrode layer.

3. A power semiconductor chip comprising:

a semiconductor layer including a main cell region and a sensor region;

a plurality of power semiconductor transistors disposed in the main cell region and each including the power semiconductor device of claim 2;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

4. The power semiconductor device of claim 1, wherein the at least one pair of first trenches and the at least one second trench have a stripe type.

5. A power semiconductor chip comprising:

a semiconductor layer including a main cell region and a sensor region;

a plurality of power semiconductor transistors disposed in the main cell region and each including the power semiconductor device of claim 4;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

6. The power semiconductor device of claim 1, wherein the well region is bisected by the at least one second trench.

7. A power semiconductor chip comprising:

a semiconductor layer including a main cell region and a sensor region;

a plurality of power semiconductor transistors disposed in the main cell region and each including the power semiconductor device of claim 6;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

8. The power semiconductor device of claim 1, further comprising:

an emitter electrode layer connected to the emitter region.

9. A power semiconductor chip comprising:

a semiconductor layer including a main cell region and a sensor region;

a plurality of power semiconductor transistors disposed in the main cell region and each including the power semiconductor device of claim 8;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

10. The power semiconductor device of claim 1, wherein the gate insulating layer is disposed on an inner surface of the at least one second trench, and the gate electrode layer is disposed on the gate insulating layer to be disposed in the at least one second trench.

11. A power semiconductor chip comprising:

a semiconductor layer including a main cell region and a sensor region;

a plurality of power semiconductor transistors disposed in the main cell region and each including the power semiconductor device of claim 10;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

12. The power semiconductor device of claim 1, further comprising:

a collector region in the semiconductor layer under the drift region and having the first conductivity type.

13. A power semiconductor chip comprising:

a semiconductor layer including a main cell region and a sensor region;

a plurality of power semiconductor transistors disposed in the main cell region and each including the power semiconductor device of claim 12;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

14. A power semiconductor chip comprising:

a semiconductor layer including a main cell region and a sensor region;

a plurality of power semiconductor transistors disposed in the main cell region and each including the power semiconductor device of claim 1;

a plurality of current sensor transistors disposed in the sensor region for monitoring currents of the power semiconductor transistors;

an emitter terminal connected to emitter electrodes of the plurality of power semiconductor transistors;

a current sensor terminal connected to emitter electrodes of the plurality of current sensor transistors; and a gate terminal connected to gate electrodes of the power semiconductor transistors and gate electrodes of the plurality of current sensor transistors.

* * * * *